United States Patent [19]

Kellerhals et al.

[11] Patent Number: 4,563,579
[45] Date of Patent: Jan. 7, 1986

[54] PROCEDURE FOR RECORDING ION-CYCLOTRON-RESONANCE SPECTRA AND APPARATUS FOR CARRYING OUT THE PROCEDURE

[75] Inventors: Hanspeter Kellerhals, Uster; Martin Allemann, Hinwil, both of Switzerland

[73] Assignee: Spectrospin AG, Zurich, Switzerland

[21] Appl. No.: 645,051

[22] Filed: Aug. 28, 1984

[30] Foreign Application Priority Data

Aug. 30, 1983 [DE] Fed. Rep. of Germany ....... 3331136

[51] Int. Cl.$^4$ ............................................ G01N 24/14
[52] U.S. Cl. ...................................... 250/291; 250/288
[58] Field of Search ............... 250/291, 290, 288, 281, 250/282

[56] References Cited

U.S. PATENT DOCUMENTS

| | | | |
|---|---|---|---|
| 3,502,867 | 3/1970 | Beauchamp | 250/41.9 |
| 3,535,512 | 10/1970 | Baldeschwieler | 250/41.9 |

OTHER PUBLICATIONS

Applied Physics, p. 35, 1976–"Secondary–Ion Emission of Amino Acids".

*Primary Examiner*—Alfred E. Smith
*Assistant Examiner*—Jack I. Berman
*Attorney, Agent, or Firm*—Kokjer, Kircher, Bradley, Wharton, Bowman & Johnson

[57] ABSTRACT

In a procedure for recording ion-cyclotron resonance spectra or an apparatus for carrying out the procedure, gaseous ions of a sample substance in an ultrahigh vacuum are simultaneously exposed to a constant magnetic field $B_O$ and to a high frequency field which is perpendicular to it, with resonances being excited when the frequency of the alternating field corresponds to the rotational frequency of the ions which move on circular paths in the constant magnetic field. To produce gaseous ions of the sample substance, the latter is bombarded with additional gaseous, high-energy ions of a primary substance. The primary ions are produced in the measuring cell by means of an electron beam and excited to a high energy level by means of ion-cyclotron resonance (FIG. 2).

14 Claims, 4 Drawing Figures

PROCEDURE FOR RECORDING ION-CYCLOTRON-RESONANCE SPECTRA AND APPARATUS FOR CARRYING OUT THE PROCEDURE

BACKGROUND AND SUMMARY OF THE INVENTION

The invention is based on a method for recording ion-cyclotron-resonance spectra in which gaseous ions of a sample substance are produced and, in an ultrahigh vacuum, are exposed to a homogenous constant magnetic field and to an oscillating electric field of a given frequency, which is perpendicular to the magnetic field, a process during which ions brought to resonance by the alternating field produce a test signal and, moreover, the gaseous ions (secondary ions) of the sample substance are produced by bombardment of the sample substance with other gaseous, high-energy ions (primary ions).

The process of ion-cyclotron resonance (ICR) is known, from the DE-OS No. 31 24 465 (U.S. Pat. No. 4,464,570, for example.

In ICR-spectroscopy, which can be considered a special case of mass spectroscopy, producing gaseous ions from the molecules of a sample substance to be examined is a common problem. These gaseous ions are required because they are brought to resonance in ICR-spectroscopy.

In producing these gaseous ions, a high efficiency factor is desired on the one hand and a production process that is as gentle as possible on the other. High efficiency leads to a high ion yield and with it exposure to a test signal of relatively strong magnitude or a high degree of sensitivity for the apparatus used. The demand for as gentle a process as possible means that the molecules should reach a charged state as intact as possible and as chemically unchanged as possible. With respect to these two requirements, particular difficulties arise if the sample substance is almost nonvolatile and solid.

From the classical mass spectroscopy, in which, as is known, the ions are accelerated lineraly and not, as in ICR-spectroscopy, on a circular path, several methods are known to meet the requirements mentioned for the production of gaseous ions.

In chemical ionization (CI), very reactive primary ions are chemically brought into interaction with the already gaseous molecules of the sample substance that are to be examined. Although this process is very gentle, it has the disadvantage that the sample substance to be examined must first be evaporated, which dramatically limits the range of applications.

In direct chemical ionization (DCI), as with chemical ionization, primary ions are also used. In this case, primary ions directly act on a solid sample substance. But the disadvantage of this well-known method is its very low yield.

In laser desorption, a solid sample substance is directly exposed to a laser beam at high-energy density. In many fields of application, this method satisfies the demand for a good yield of intact molecular ions. The disadvantage of this process, however, is that it also requires a considerable amount of equipment investment.

With the field desorption method (FD), molecules of the sample substance are exposed to extremely high electric field intensities on specially manufactured electrodes so that part of these molecules are emitted as ions. This method has the disadvantage, however, that it is extremely complicated to carry it out, so that it can only be used by persons with considerable experimental experience and skill. Moreover, it is necessary to produce special electrodes first and to prepare the sample in an appropriate manner.

Finally, the fast atom bombardment method (FAB) method is known, in which the sample is bombarded with linearly accelerated, high-energy inert gas atoms (or ions). In this process, the sample substance is generally first dissolved in a glycerin matrix so that the surfaces are constantly regenerated by diffusion in a vacuum, which means that molecules of the sample substance are always present on the surface. However, the sample substances to be examined can also be applied to metal surfaces in a suitable manner, as described by A. Benninghofen and W. Sichtermann in the U.S. Journal of Applied Physics 11, pages 35–39, 1976. For this purpose, the energy of the molecules that strike the sample substance is usually in the 5,000 to 10,000 eV range.

In principle, the aforementioned methods known in mass spectroscopy can also be applied in ICR-spectroscopy if ions of almost nonvolatile, complex sample substances must be produced. However, the disadvantages described in detail with the methods are of even greater consequence in ICR-spectroscopy, because all additional equipment has to operate under ultrahigh-vacuum conditions, i.e., under vacuum conditions equivalent to a pressure approximately two orders of magnitude lower than in classical mass spectroscopy.

The invention, therefore, starts out from the task to further develop a method of the type described at the beginning to the point where, with a low investment in equipment, gaseous ions can be produced under the ultrahigh-vacuum conditions of ICR-spectroscopy, even from almost nonvolatile and complex sample substances.

In accordance with the invention, this task is accomplished by exciting the primary ions by ion-cyclotron resonance also.

The method in accordance with the invention thus has the fundamental advantage that excitation of the primary ions in accomplished in the same way as the excitation of the secondary ions that are to be measured, so that to that extent, comparable test conditions exist.

In this connection, an embodiment is preferred in which the primary ions are produced in the immediate proximity of the sample substance and primary and the secondary ions are preferably excited in the same measuring cell (analyzer), using the same resonance equipment. In this way, a considerable reduction of the equipment investment results because additional resources are only necessary insofar as the production of the primary ions is required, while the excitation of the primary ions to the required energy level can be achieved with the same equipment resources that are available anyway for the subsequent actual ICR-measurement proper.

In a preferred embodiment of the method in accordance with the invention, the primary ions are produced from an inert gas, preferably argon. In accordance with the invention, it is, however, also possible to use a chemically reactive gas instead of an inert gas.

A particularly simple set-up is accomplished if, in a more elaborate version of the invention, the primary ions are produced in a measuring cell (analyzer) by an electron beam introduced at a distance from the sample substance and the amplitude of the alternating field for the ICR of the primary ions is adjusted in such a way that for the primary ions a circular path results that runs through the location of the sample substance. In this case, all of the additional investment consists in providing means for the production of an electron beam, whose position in the space must only be adjusted with reference to the position of the sample substance in a way which suits the measuring conditions and the ions used in a given situation.

To eliminate undesirable interactions between the excited primary ions and the secondary ions that are to be measured, in further elaboration of the invention, an alternating field for the primary ions is introduced before excitation of the ICR; its amplitude must be set to a level at which the primary ions reach a collector electrode, which is preferably a mass electrode. In this way, it is possible to "clean" the measuring cell before recording the actual ICR-spectrum by introducing a simple high frequency pulse so that the primary ions are selectively removed. This selective removal of the primary ions is necessary because by applying an ordinary quench pulse, during which the ion trap is temporarily opened, the secondary ions that have just been produced would also be removed.

To carry out the procedure in accordance with the invention, it is preferred that an apparatus be used in which a sample carrier for the sample substance is situated in an ultrahigh vacuum measuring cell, the measuring cell furthermore contains an ionizable medium, the means for ionizing the medium, further means for exciting an ICR of the ions of the medium, and means for exciting and measuring the ICR of the ions of the sample substance are provided.

Along with the above, preferrably outside the measuring cell, an arrangement for producing an electron beam is provided which is introduced through openings into the measuring cell in such a way that its path runs at a preselected distance from the sample carrier.

A particularly good effect is achieved if the measuring cell has a circular cylindrical shape, with four cylinder barrel segment-shaped surfaces provided which, being situated opposited each other in pairs, form a transmitter or receiver and are DC-coupled to mass, and further two cover surfaces are connected to a finite potential to serve as ion traps. This arrangement has the advantage that because of the circular cylindrical shape of the measuring cell, efficient use is made of the space in a solenoid coil as it is used with super conductive magnets for producing high constant magnetic field intensities. Feeding the electron beam or introducing the sample in a direction parallel to the axis of the measuring cell corresponds here with a direction of particularly good access to the portion of the field of the solenoid coil that can be used for measuring purposes. The direct current coupling of the above mentioned segment surfaces has the advantage that with the above-described strong excitation of the primary ions, immediately prior to the beginning of the actual ICR experiment, the radius of their orbit becomes so great that the primary ions come in contact with the transmitter or receiver surfaces and are removed because of the grounded DC-coupling to mass. Connecting the cover surfaces to a finite potential makes it possible, depending on the polarity of this potential, to capture positive or negative ions in the measuring cell.

In further elaboration of the apparatus in accordance with the invention, the sample carrier is attached to a push rod which runs in parallel to the axis of the measuring cell, inside the latter, and can be moved in a radial direction. This arrangement has the advantage that the position of the sample carrier can be adapted in a radial direction to the appropriate measuring conditions. Because the sample substance must be located on the rotational path of the primary ions, it is easy to adapt the arrangement to the primary ions used in a particular case or the strength of the magnetic field, etc.

Additional advantages are evident in the description and the enclosed drawing.

DESCRIPTION OF THE PREFERRED EMBODIMENTS

Figure 1:
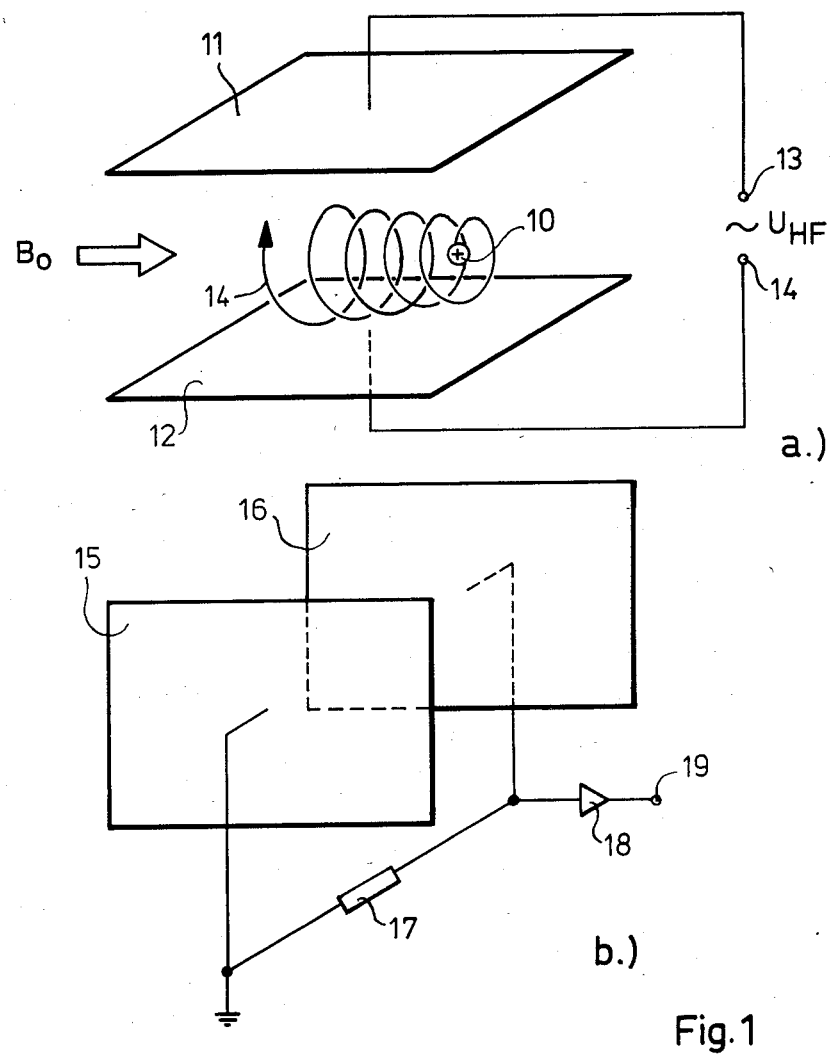
Figure 2:
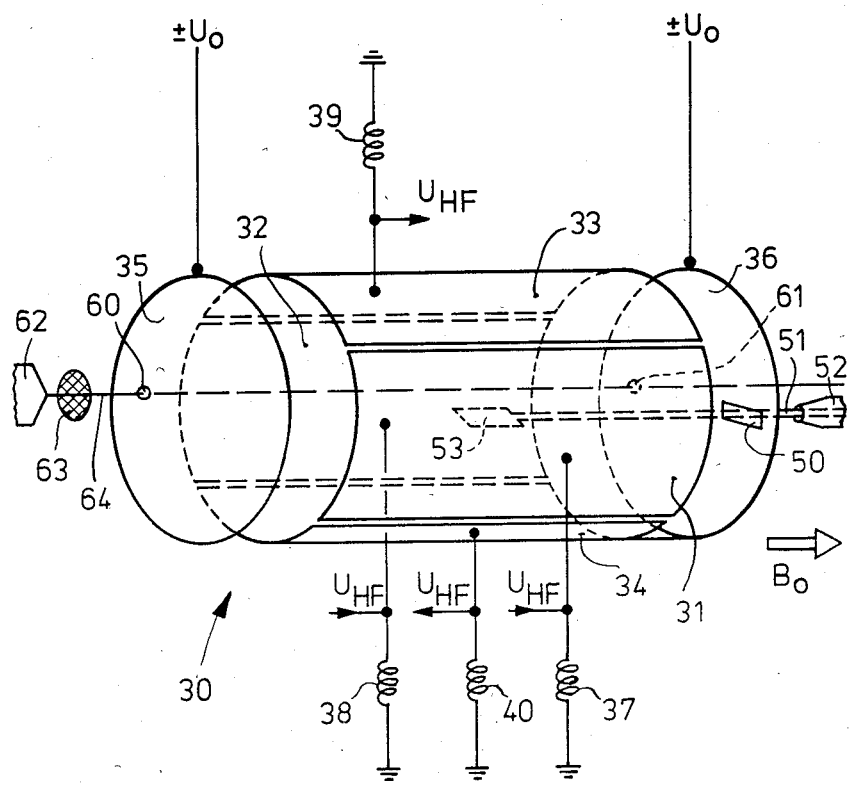
Figure 3:
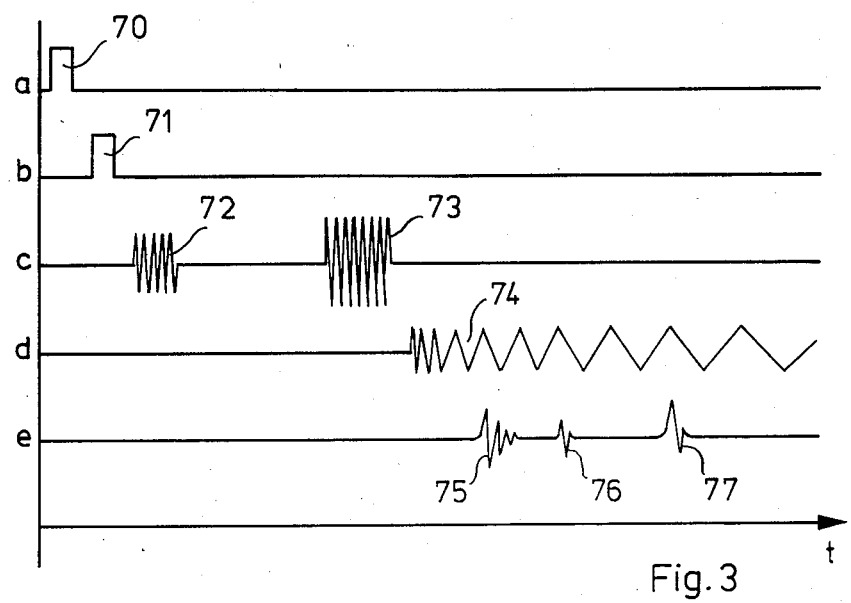
Figure 4:
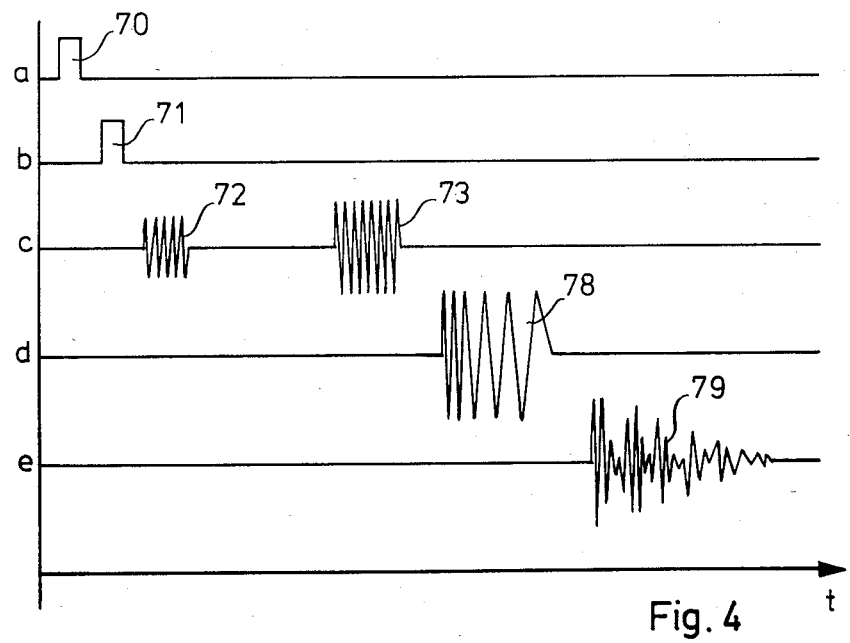

The invention is represented in the drawing and will be explained in more detail in the following description. Illustrated are:

FIG. 1, a schematic representation explaining the ion-cyclotron resonance produced, FIG. 2, a perspective schematic representation of an ICR measuring cell, FIG. 3, a time diagram to explain one embodiment of a method in accordance with the invention, in which the ICR-spectrum is excited by slow frequency variations, FIG. 4, a representation in accordance with FIG. 3, except that the ICR-sprectrum is recored according to the Fourier method.

In FIG. 1a, 10 represents an ion of a sample substance. The ion 10 is located between two plates, 11, 12 which form a high-frequency transmitter. For this purpose, plates 11, 12 are connected by connectors 13, 14 to which a high frequency voltage $U_{HF}$ can be added. Ion (10) is furthermore subject to the effect of high strong constant magnetic field $B_0$, which runs parallel to the surfaces of plates 11, 12, i.e., is oriented perpendicular to the alternating field created between them as a result of the voltage $U_{HF}$. It is known that, subject to the effect of a constant magnetic field, a charged particle moves along a curved path. If the magnetic field has a particularly high field intensity, and orbit results, the radius (of the orbit) can be in the centimeter range for ordinary ions. If perpendicular to the constant magnetic field an alternating electric field is applied, the frequency of which is calculated in such a way that it corresponds to the rotational frequency of the charged particle, the charged particle is excited, so that the radius of the orbit increases. This results in a spiral path, as indicated by line 14 in FIG. 1a. The resonance frequency to be applied for this purpose is approximately equal to the product of the charge of the charged particle and the intensity of the magnetic field, divided by the mass of the particle.

In ICR-spectroscopy, in each case an entire ion-cluster is excited by the mentioned high frequency alternating field. If this excitation is disconnected at a specific moment, an ICR signal in the form of a current can be measured by means of two plates 15, 16, which are arranged perpendicular to plates 11, 12. In the illustration, the representation in FIGS. 1a and 1b has been separated for reasons of clarity only. If the receiver plates 15, 16 are connected across a resistor 17, which, for example, is grounded at one end, across an amplifier 18, the ICR signal can be measured at its other terminal at a connector 19.

From the frequency proportions of the measured ICR signal, mass numbers can then be determined which belong to the ions 10 contained in the sample substance.

FIG. 2 represents an especially preferred embodiment of a measuring cell which is suited for caryring out the procedure in accordance with the invention. This measuring cell 30 is a circular cylindrical shaped and its cylinder barrel surface is divided into four segments. On the one hand, transmitter surfaces 31, 32 which are situated opposite each other are provided, and on the other hand, receiver surfaces 33, 34, the function of which corresponds to that of plates 11, 12, 15 and 16 in FIG. 1.

The circular cylindrical measuring cell 30 in accordance with FIG. 2, is closed off by circular cover surfaces 35, 36.

As indicated by arrows, a transmitter signal in the form of a high frequency voltage $U_{HF}$ can be supplied to the transmitter surfaces 31, 32. Inductances 37, 38 are connected from this point of the transmitter lead to mass, so that the transmitter surfaces 31, 32 are DC-coupled to mass. In analogy thereto, a high frequency voltage $U_{Hf}$ can be measured at the receiver surfaces 33, 34, again as indicated by arrows in FIG. 2, with these receiver surfaces 33, 34 also DC-coupled to mass across inductances 39, 40.

The cover surfaces 35, 36 can alternatively be connected to a positive potential $+U_O$ or a negative potential $-U_O$.

Thus, measuring cell 30 forms a so-called ion trap. Because at a certain effective intensity of the constant magnetic field $B_O$, the radius of the ion paths forming in measuring cell 30 is so low that the ions cannot come in contact with the transmitter or receiver surfaces 31 through 34, which are DC-coupled to mass. With positive ions in measuring cell 30, the cover surfaces 35, 36 are connected to a positive reference potential $+U_O$, so that the positive ions are repelled by these cover surfaces 35, 36. With careful maintenance of the ultrahigh vacuum established in the measuring cell 30, in this way, ions can be locked in measuring cell 30 for several hours.

For the introduction of a sample substance into the measuring cell 30, a radial slot 50 is provided in a cover surface 36 through which a push rod 51 can be pushed by means of a handle 52. A sample carrier 53, onto which the sample substance to be examined is put, is located at the end of push rod 51. The axis of push rod 51 runs parallel to the longitudinal axis of the measuring cell 30, but is installed at a finite distance from the same, which can be adjusted by moving the push rod 51 radially along the radial slot 50. It shall be understood that the arrangement of elements 50 through 53 shall be regarded here as being schematic only; other suitable devices which permit a radial movement of a sample carrier in measuring cell 30 can, of course, also be used.

Furthermore, the measuring cell 30 is filled with an ionizable medium, preferably an inert gas such as argon. In order to produce ions within this ionizable medium, the cover surfaces 35, 36 are provided with openings 60, 61 which are aligned with each other and through which an electron beam 64 can be directed into the interior of measuring cell 30. Electron beam 64 is produced in an essentially known way by means of a filament 62 and a grid electrode 63, which are located near one of the openings 60. In this case, the electron beam 64 is likewise introduced into the measuring cell 30 in parallel to the axis of the latter, but again at a certain distance from it.

To carry out the procedure in accordance with the invention, across a gas intake, a suitable vapor pressure of the ionizable gas, argon, for example, is first set in the measuring cell 30.

The additional steps of the process will now be explained on the basis of the time diagrams of FIGS. 3 and 4.

First of all, a so-called quench pulse 70 is set, as shown in FIG. 3a, which briefly opens the ion trap and thus removes all the ions still present in measuring cell 30. To achieve this, the surfaces delimiting measuring cell 30 can, for instance, be briefly connected to a potential of suitable polarity.

After disconnecting the quench pulse 70, as evident in FIG. 3b, a pulse 71 is generated, which assures the production of the electron beam 64 for a brief period of time. Electron beam 64 causes ions to be produced along its path in measuring cell 30 in the ionizable argon contained in the latter. At first, however, these ions initially have a relatively low energy level. To excite these primary ions of argon, an initial oscillating field excitation 72 is subsequently introduced for the primary ions, as shown in FIG. 3c. For this purpose, the frequency of this field excitation 72 shall be adjusted in such a way that it matches the rotational frequency of the primary ions as mentioned earlier.

Amplitude and duration of field excitation 72, on the other hand, must be adjusted in such a way that the primary ions follow a defined orbit within the measuring cell 30. For this purpose, the radius of this orbit is set in such a way that the excited, now high-energy primary ions strike the sample substance in the area of the sample carrier 53, so that secondary ions are produced in the sample substance. Because this process takes place within a very compact volume and the production of the primary ions, their excitation, and the production of the secondary ions occur chronologically one right after the other, as a result, the production of the secondary ions bears, on the other hand, sufficiently gentle so that no chemical change in the secondary ions occurs.

After the production of the secondary ions has been completed as a result of the sample substance being struck by the excited primary ions, a second alternating field excitation 73 is introduced, as seen in FIG. 3c. This second field excitation 73 has a much higher amplitude than the first field excitation 72, so that the radius of the rotational path described by the primary ions is thereby considerably increased. The primary ions are thus brought in contact with the cylinder-barrel segment shaped surfaces 31 through 34 of transmitter and receiver and are removed as a result of their DC-coupling across inductances 37 through 40. The inside of the measuring cell 30 is now totally free of ions that do not originate from the sample substance.

According to the variant of the process in accordance with the invention shown in FIG. 3, as observed in FIG. 3d, an oscillating field excitation 74 is now introduced for the secondary electrons, the frequency of which varies with time. This causes the ICR-spectrum to be scanned in one frequency pass so that, one after another, ICR signals 75, 76, and 77 occur, which, in each case, correspond to the introduced frequency of the oscillating field excitation 74. ICR-signals 75, 76, and 77 can be seen in FIG. 3e. It shall be understood that the frequency pass as a result of excitation 74, illustrated in FIG. 3d, can even be carried out repeatedly, one after another, thereby accumulating the received ICR signals received 75 through 77 in a storage unit and increasing the singal-noise ratio by determining the mean value.

Although in the variant of a procedure in accordance with the invention depicted in FIG. 4, the steps of the procedure represented by FIGS. 4a through 4c are identical to those of FIGS. 3a through 3c, instead of oscillating field excitation 74 with its slowly changing frequencies in accordance with FIG. 3d, in the process in accordance with FIG. 4d an excitation 78 in the form of a Fourier signal is introduced. This means that all the frequencies within a given limited frequency range are introduced simulaneously and all the resonances located in this range are thereby excited. After disconnection of Fourier excitation 78, an interferogram 79 results in the receiver, as depicted in FIG. 4e. Interferogram 79, which contains all the spectral components in the time range, is converted to the frequency range by means of known procedures of the Fourier transformation, so that a frequency spectrum as previously illustrated in FIG. 3e results.

The advantage of the Fourier technique, however, is that in the same measuring period a significantly greater signal yield can be attained. Because instead of slowly scanning the frequencies of the spectrum one after the other, which requires a certain measuring period, numerous Fourier excitations 78 can be introduced successively, exciting the entire spectrum at any given time. After each introduced Fourier excitation 78, however, a separate interferogram 79 can be entered into a storage unit and added up there so that using the previously mentioned method of determining the mean value, a high signal-noise ratio can be attained.

In a typical application, the length of measuring cell 30 is approximately 6 cm, the diameter approximately 5 cm. The intensity of the constant magnetic field $B_O$ is, for instance, 4.7 T if a super conductive magnet is used, which corresponds to an excitation frequency in the range of 10 MHz with customary mass numbers. In a typical case, the pressure prevailing in the measuring cell is $10^{-7}$ to $10^{-9}$ mbar.

What is claimed is:

1. A procedure of recording ion-cyclotron resonance spectra in which gaseous ions of a sample substance are produced and, in an ultrahigh vacuum, are exposed to a homogeneous constant magnetic field and to an alternating electric field of a given frequency which is perpendicular to the magnetic field, with ions brought to resonance by the alternating field producing a test signal and, moreover, the gaseous ions (secondary ions) of the sample substance being produced by bombardment of the sample substance with additional gaseous high-energy ions (primary ions), characterized by the fact that the primary ions are also excited by ion-cyclotron resonance.

2. Procedure in accordance with claim 1, characterized by the fact that the primary ions are produced in the immediate vicinity of the sample substance.

3. Procedure in accordance with claim 1, characterized by the fact that primary and secondary ions are excited in the same measuring cell (30), using the same resonance apparatus (31, 32).

4. Procedure in accordance with claim 1, characterized by the fact that the primary ions are produced from an inert gas, preferably argon.

5. Procedure in accordance with claim 1, characterized by the fact that the primary ions are produced from a chemically reactive gas.

6. Procedure in accordance with claim 1, characterized by the fact that primary ions are produced in the measuring cell (30) by an electron beam (64) introduced at a distance from the sample substance and that the amplitude of the alternating field (72) for the ion-cyclotron resonance of the primary ions is adjusted in such a way that a circular primary ion path results that goes through the location (53) of the sample substance.

7. Procedure in accordance with claim 6, characterized by the fact that prior to the excitation of the ion-cyclotron resonance of the secondary ions, an alternating field (73) for the primary ions is introduced, its amplitude being so large that the primary ions reach a collector electrode.

8. Procedure in accordance with claim 7, characterized by the fact that the electron collector electrode for direct current is a mass electrode (31, 32, 33, 34).

9. Apparatus for recording ion resonance spectra of a sample substance, said apparatus comprising: an ultrahigh vacuum measuring cell subjected to an ultrahigh vacuum and containing an ionizable medium;
    a sample carrier for the sample substance situated in said measuring cell;
    means for ionizing said medium to produce primary ions;
    means for exciting an ion-cyclotron resonance of said primary ions and effecting bombardment of the sample substance with excited primary ions to produce secondary ions of the sample substance;
    means for applying to the measuring cell a homogeneous constant magnetic field and an alternating electric field perpendicular to the magnetic field at a frequency to excite the secondary ions to resonance; and
    means for measuring the ion-cyclotron resonance of the secondary ions.

10. Apparatus in accordance with claim 14, characterized by the fact that outside the measuring cell (30), an arrangement (62, 63) is provided for producing an electron beam (64) which is introduced into the measuring cell (30) through openings (60, 61) in such a way that its path runs at a preselected distance from the sample carrier (53).

11. Apparatus in accordance with claim 14, characterized by the fact that the measuring cell (30) has the shape of a circular cylinder, with four cylinder-barrel segment surfaces (31 through 34) provided, which are situated opposite each other in pairs to form a transmitter (31, 32) or a receiver (33, 34) and are DC-coupled to mass, and further, that two cover surfaces (35, 36), (which function) as ion traps are connected to a finite potential ($\pm U_O$).

12. Apparatus in accordance with claim 11, characterized by the fact that the sample carrier (53) is attached to a rod (51) which runs parallel to the axis of the measuring cell (30) inside the latter and can be moved in a radial direction.

13. Apparatus in accordance with claim 12, characterized by the fact that the electron beam (64) is conducted in parallel to the axis of the measuring cell (30).

14. In an ion-resonance spectra recording apparatus of the type in which gaseous secondary ions of a sample substance are produced by bombardment with high energy primary ions exposed in an ultrahigh vacuum to a homogeneous constant magnetic field and to an alternating electric field of a given frequency perpendicular to said magnetic field, said apparatus comprising:
  a measuring cell to which said ultrahigh vacuum and said magnetic and electric fields are applied, said cell containing an ionizable medium;
  a sample carrier for said sample substance situated in the measuring cell;
  means for ionizing said medium to produce said primary ions; and
  means for exciting said primary ions to ion-cyclotron resonant state in which the excited primary ions bombard said sample substance to produce said secondary ions, whereby the secondary ions can then be brought to resonance by the alternating electric field to produce a test signal indicative of the ion-cyclotron resonance of the secondary ions.

* * * * *